US012725763B2

(12) United States Patent
Sugiyama

(10) Patent No.: US 12,725,763 B2
(45) Date of Patent: Sep. 1, 2026

(54) CERAMIC SINTERED BODY FOR SEMICONDUCTOR PRODUCTION EQUIPMENT AND MANUFACTURING METHOD THEREOF

(71) Applicant: CoorsTek KK, Tokyo (JP)

(72) Inventor: Manami Sugiyama, Kariya City (JP)

(73) Assignee: CoorsTek KK, Tokyo (JP)

( * ) Notice: Subject to any disclaimer, the term of this patent is extended or adjusted under 35 U.S.C. 154(b) by 303 days.

(21) Appl. No.: 18/543,384

(22) Filed: Dec. 18, 2023

(65) Prior Publication Data

US 2024/0212990 A1 Jun. 27, 2024

(30) Foreign Application Priority Data

Dec. 27, 2022 (JP) ................................ 2022-209882
Oct. 30, 2023 (JP) ................................ 2023-185413

(51) Int. Cl.
*H01J 37/32* (2006.01)
*H10P 72/00* (2026.01)

(52) U.S. Cl.
CPC .. *H01J 37/32477* (2013.01); *H01J 37/32807* (2013.01); *H10P 72/0421* (2026.01); *H01J 2237/3341* (2013.01)

(58) Field of Classification Search
CPC ................................................... H01P 72/0421
See application file for complete search history.

(56) References Cited

U.S. PATENT DOCUMENTS

| | | | | |
|---|---|---|---|---|
| 9,969,652 | B2 | 5/2018 | Yano et al. | |
| 2004/0126614 | A1* | 7/2004 | Maeda | C23C 30/00 428/688 |
| 2022/0055950 | A1 | 2/2022 | Yamaguchi et al. | |

FOREIGN PATENT DOCUMENTS

| | | | |
|---|---|---|---|
| JP | 5911036 | B1 | 4/2016 |
| JP | 2019-69876 | A | 5/2019 |
| WO | 2020/179296 | A1 | 9/2020 |

OTHER PUBLICATIONS

English machine translation for JP2017-218345. (Year: 2017).*

* cited by examiner

*Primary Examiner* — Michael C Miggins
(74) *Attorney, Agent, or Firm* — WHDA, LLP

(57) ABSTRACT

A ceramic sintered body for semiconductor production equipment and a manufacturing method thereof capable of giving a high-density oxyfluoride ceramic sintered body without any peculiar circumstances. The ceramic sintered body for semiconductor production equipment of the present invention has a main phase of an oxyfluoride with a polycrystalline structure having 50% or more of crystals with a grain size of 1 to 5 μm or has a multiple phase of the oxyfluoride and a fluoride; and has an L* value of 20 to 65, an a* value of −1 to 10 and a b* value of −1 to 10 in the L*a*b* color system.

6 Claims, No Drawings

CERAMIC SINTERED BODY FOR SEMICONDUCTOR PRODUCTION EQUIPMENT AND MANUFACTURING METHOD THEREOF

BACKGROUND OF THE INVENTION

Field of Invention

The present invention relates to a ceramic sintered body for semiconductor production equipment, in more detail, an oxyfluoride ceramic sintered body and manufacturing method thereof.

Description of the Related Art

In each process of manufacturing a semiconductor, especially in each process of dry etching, plasma etching and cleaning, a fluorine-based corrosive gas, a chlorine-based corrosive gas and plasma using both of them are in use. These corrosive gases and plasma corrode components of semiconductor production equipment, so that fine particles exfoliated from the surface of the components adhere to the semiconductor surface and are liable to cause defective product.

Therefore, sintered bodies of aluminum oxide, yttrium oxide, aluminum yttrium composite oxide and yttrium fluoride are used as components of semiconductor production equipment because of having good tolerance to halogen-based plasma.

Nowadays fluoride ceramics sintered bodies and oxyfluoride ceramics sintered bodies representing yttrium fluoride are expected to apply to components used in the fluorine-based plasma etching process, because of being more resistant to a fluorine-based corrosive gas and plasma than the foregoing various materials.

However, it is more difficult to obtain densified sintered bodies from oxyfluoride ceramics than from conventional ceramics, so that several manufacturing methods have been proposed to solve the matter.

For example, JP 5911036 B discloses a method of manufacturing a sintered body comprising a step of obtaining a hydraulic pressed compact from raw material powder containing a yttrium oxyfluoride powder with an average particle size of 1.1 μm or less and a step of sintering the compact thus formed at 800 to 1800° C. under a pressure of 5 to 100 MPa. JP 5911036 B further discloses a method of manufacturing a sintered body comprising a step of pressure-molding raw material powder containing a yttrium oxyfluoride powder with an average particle size of 1.1 μm or less by means of a hydraulic press and then isostatically pressing them to obtain a compact; and a step of sintering the compact at 1000 to 2000° C. under no pressure condition.

JP 2019-69876 A discloses a method of manufacturing a sintered body of fluoride ceramics comprising a step of preparing a molded body of fluoride ceramics containing oxyfluoride ceramics, and a step of sintering the molded body at atmospheric pressure in the circumstances where moisture is intercepted.

WO 2020/179296 discloses as follows: A sintered body composed of a fluoride or an oxyfluoride of a rare-earth element, having at least a phase of a compound containing a rare-earth element and fluorine. The sintered body has a L* value of 70 or more in the L*a*b* color system, an average crystal grain size of 10 μm or less, a relative density of 95% or more, and a three-point bending strength of 100 MPa or more. Additionally, the sintered body is oxygen-free, or 13 mass % at most in case some oxygen is present.

SUMMARY OF THE INVENTION

In the manufacturing method described in JP 5911036 B, it is necessary to heat the sintered body of yttrium oxyfluoride ceramic under pressure to increase the density, and consequently complicated and expensive equipment are required for heating under pressure, such as hot pressing (HP), spark plasma sintering (SPS) and hot isostatic pressing (HIP). In the manufacturing method comprising sintering under no pressure, it is impossible to produce a sufficiently densified sintered body unless the sintering temperature rises to 1000° C. or more.

According to JP 2019-69876 A, a high-density sintered body of fluoride ceramics is successfully obtained by sintering a molded body of fluoride ceramics at relatively low temperature without pressure-sintering, if only the molded body is sintered in the state of any moisture blocked. However, in order to stop the molded body from being contact with moisture, it is necessary to lay the molded body of fluoride ceramics in the moisture blocking materials made of carbon material, which makes the process complicated and costly. In addition, this manufacturing method is not versatile, because sizes and shapes of the sintered bodies are restricted.

In short, conventional methods of manufacturing sintered bodies of oxyfluoride ceramics need adoption of pressure sintering, more severe manufacturing condition about sintering temperature, and also the moisture blocking technique for laying the oxyfluoride ceramics in the moisture blocking material etc. Without these complicated and costly means, oxyfluoride ceramics with sufficiently high density could not be obtained.

The sintered body of oxyfluoride ceramics is excellent in plasma resistance. The denser the sintered body, the better the plasma resistance becomes. However, originally, a high-density sintered body is not easy to obtain from oxyfluoride ceramics. One of the reasons is considered that residual moisture in the molded body inhibits the densification of the molded body during sintering.

Accordingly, producing an indicator that reflects the influence of residual moisture will be effective in manufacturing the sintered body of oxyfluoride ceramics, because an oxyfluoride ceramic is especially difficult to be densified.

In the invention described in WO2020/179296, an L* value in the L*a*b* color system is 70 or more. However, concerning the range defined in the invention, the information on the residual moisture is not taken into account.

An object of the present invention is to provide a sintered body of oxyfluoride ceramics having density equivalent to or more than a former one and higher plasma resistance, and to provide a simple manufacturing method thereof.

The ceramic sintered body for semiconductor production equipment of the present invention has a main phase of an oxyfluoride with a polycrystalline structure having 50% or more of crystals having a grain size of 1 to 5 μm or has a multiple phase of the oxyfluoride and a fluoride; and has an L* value of 20 to 65, an a* value of −1 to 10 and a b* value of −1 to 10 in the L*a*b* color system of the sintered body.

With this constitution, an oxyfluoride ceramic sintered body ensuring sufficient plasma resistance can be effectively obtained using parameters besides density.

The method of manufacturing the foregoing ceramic sintered body, to put it concretely, an oxyfluoride ceramic sintered body for semiconductor production equipment comprises a process 1 of preparing a green molded body of an oxyfluoride-containing raw material powder; a process 2 having a first step of heating the green molded body in an air atmosphere at atmospheric pressure at a first heating rate from room temperature to a first retention temperature, keeping it for a first retention time, and cooling it down to room temperature naturally, and a second step 2 of heating the heated green molded body in an inert atmosphere including more gas than the air atmosphere at atmospheric pressure to a second retention temperature which is higher than the first retention temperature, keeping it for a second retention time which is longer than the first retention time, cooling it down to room temperature naturally, and obtaining a degreased and dehydrated molded body; and a process 3 of sintering the degreased and dehydrated molded body to obtain the ceramic sintered body. The sintered body obtained in the process 3 has a main phase of an oxyfluoride with a polycrystalline structure having 50% or more of crystals having a grain size of 1 to 5 μm or has a multiple phase of the oxyfluoride and a fluoride; and has an L* value of 20 to 65, an a* value of −1 to 10 and a b* value of −1 to 10 in the L*a*b* color system.

In a specific example of the method of manufacturing the oxyfluoride ceramic sintered body, the first retention temperature is 350 to 600° C., the first retention time is 30 to 1200 min, the second retention temperature is 800 to 980° C., and the second retention time is 100 to 1000 min.

With the foregoing constitution, an oxyfluoride ceramic sintered body ensuring sufficient plasma resistance can be realized.

In the present invention, the molded body after the process 2 has a bulk density of 2.6 g/cm$^3$ or more, which is preferable.

The present invention can provide the high-density sintered body of oxyfluoride ceramics without adopting the unique manufacturing conditions like the conventional art, such as pressure sintering and strict sintering temperature, and without using moisture blocking materials in which it is laid. Furthermore, the sintered body of oxyfluoride ceramics thus obtained is excellent in practicability, especially because the influence of residual moisture is suppressed and the degree of influence is given as digitized so as to be grasped surely.

DESCRIPTION OF THE PREFERRED EMBODIMENTS

The present invention will be described in detail below. The ceramic sintered body for semiconductor production equipment (hereinafter simply referred to as "ceramic sintered body") of the present invention has a main phase of an oxyfluoride with a polycrystalline structure having 50% or more of crystals having a grain size of 1 to 5 μm or has a multiple phase of the oxyfluoride phase and a fluoride. The color difference of the ceramic sintered body is expressed as an L* value of 20 to 65, an a* value of −1 to 10, and a b* value of −1 to 10 in the L*a*b* color system.

One embodiment of a ceramic sintered body of the present invention is a polycrystalline structure having an oxyfluoride as a main component. In other words, the foregoing ceramic sintered body is a compound composed of various kinds of atoms in ceramics, and oxygen (O) and fluorine (F). Atoms suitable for the semiconductor production equipment ought to be used for this ceramic, which are one or more rare-earth elements, such as yttrium (Y), scandium (Sc), lanthanum (La), cerium (Ce) and gadolinium (Gd). Among these, yttrium is particularly preferable of use in terms of ease for manufacturing and cost.

Another embodiment of a ceramic sintered body has a multiple phase of the oxyfluoride and a fluoride. To take an example of yttrium, one or more kinds of oxyfluorides including YOF, $Y_5O_4F_7$ and $Y_7O_6F_9$ are used for the ceramic sintered body. The ceramic sintered body can be composed of only one of the above three compounds or at least two kinds thereof at an arbitrary ratio.

Besides yttrium oxyfluoride, the ceramic sintered body may include unavoidable impurities such as Na, K, Mg, Si, Fe and other publicly known metallic elements.

The ceramic sintered body has a polycrystalline structure with 50% or more of crystals having a grain size of 1 to 5 μm so that it can be well blocked from halogen-based corrosive gases.

The ceramic sintered body is composed of relatively smaller-sized constituent grains and the majority of the grains are of about the same diameter. Grains with extreme size difference may not ensure sufficient strength for the ceramic sintered body.

When the ceramic sintered body includes 50% or more of constituent crystals with a grain size of more than 5 μm, its strength may weaken. When the ceramic sintered body includes 50% or more of constituent crystals with a grain size of less than 1 μm, it may be difficult to be compatible with strength and light transmittance.

It is preferable that 70% or more of the crystals having grain sizes of 1 to 5 μm is included, and 85% or more is further preferable. As to the open porosity, 5% or less is preferable, 1% or less is further preferable, and 0.5% or less is particularly preferable.

When the color difference of the sintered body is expressed in the L*a*b* color system, the ceramic sintered body exhibits a L* value of 20 to 65, an a* value of −1 to 10 and a b* value of −1 to 10. The color of this sintered body is grayish brown to grayish white.

Sintered bodies with high plasma resistance tend to have high density, but if attention is mostly paid on increasing the density, the manufacturing conditions become more strict, which makes the products costly and limits the latitude in designing products. To avoid such worries, the present invention focuses on the chromaticity of sintered bodies, because it is correlated with not only the density but also the residual moisture content which is problematic when oxyfluorides are sintered.

A prescribed range of chromaticity proves that the moisture content of the ceramic sintered body is decreased during sintering, and that the density of the sintered body is raised. It is difficult to grasp such findings even if the density of the post-sintered body is just measured.

The L* value, standing for brightness of color (bright or dark), tends to be inversely proportional to the denseness of the sintered body. A L* value of 20 to 65 ensures the sufficient density of the sintered body of oxyfluoride ceramics. When having a L* value of more than 65, the sintered body turns grayish white, which indicates the probability that the sintered body is not densified due to the insufficient sintering and the thermal decomposition. When having a L* value of less than 20, the sintered body is gray-black though the denseness is high, which is not also desirable. A L* value of 25 to 55 is further preferable.

The values of a k and b* stand for hue and saturation. The a* represents the color strength of green to red where +a* shows a reddish tendency and −a* shows a greenish tendency. An a* value of −1 to 10 is preferable and 0 to 5 is further preferable. The greater the absolute values of a* and b* are, the stronger the colors become.

As described above, in the present invention, the denseness of the sintered body of oxyfluoride ceramics is rephrased in the chromaticity of the sintered body, which enables the influence of moisture problematic in the manufacturing process to be reflected more properly and can avoid the cost increasing for higher density of the sintered body. The chromaticity of the ceramic sintered body can confirm a significant advantage of the manufacturing method in the present invention.

The manufacturing method to obtain the sintered body of oxyfluoride ceramics comprises a process 1 of preparing a green molded body of an oxyfluoride-containing raw material powder, a process 2 of degreasing and dehydrating the green molded body, and a process 3 of sintering the degreased and dehydrated molded body to obtain the oxyfluoride ceramic sintered body. The process 2 has a first step of heating the green molded body in an air atmosphere at atmospheric pressure at a first heating rate from room temperature to a first retention temperature, keeping it for a first retention time, and cooling it down to room temperature naturally, and a second step 2 of heating the heated green molded body at atmospheric pressure in an inert atmosphere including more gas than the air atmosphere to a temperature which is higher than the first retention temperature (the retention temperature in the second step), keeping it for a time which is longer than the first retention time (the retention time in the second step), cooling it down to room temperature naturally, and obtaining a degreased and dehydrated molded body. In the process 3, the sintered body of oxyfluoride ceramics is obtained by sintering the degreased and dehydrated molded body. The ceramic sintered body thus obtained has a main phase of an oxyfluoride with a polycrystalline structure having 50% or more of crystals with a grain size of 1 to 5 μm or has a multiple phase of the oxyfluoride and a fluoride, as described above. And the ceramic sintered body has an L* value of 20 to 65, an a* value of −1 to 10 and a b* value of −1 to 10 in the L*a*b* color system. The grain size is an average crystal grain size calculated from a particle image of the scanning electron microscope (SEM).

The process 1, which gives the green molded body of an oxyfluoride-containing raw material powder, is executed by using all kinds of known technology on which no special limitations are imposed. The sintered body of the present invention contains 50% or more of grains with a size of 1 to 5 μm, so that the raw material powder preferably have an average grain size of 20 to 100 μm.

Preferably, the method of manufacturing the green molded body is the press forming and the isostatic pressing, though not limited to. The molding pressure should be set at 0.5 to 500 MPa.

Next, the green molded body is degreased and dehydrated (process 2). The process 2 has the first step of heating the green molded body in an air atmosphere at atmospheric pressure at the first heating rate from room temperature to the first retention temperature, keeping it for the first retention time, and cooling it down to room temperature naturally.

The process is mainly aimed at burning out sintering aids and binders, but simultaneously aimed at vaporizing most of moisture. The usual first heating rate is 20 to 300° C./min. The first retention temperature is 100 to 650° C., and 350 to 600° C. preferably. The first retention time is 30 to 1500 min, and 30 to 1200 min preferably. The atmosphere is preferably an air atmosphere, because it plays a role in oxidizing the sintering aids and the binders to release them from the green molded body.

Subsequently to the first step, in the second step 2, the heated green molded body is heated in an inert atmosphere at atmospheric pressure at the second heating rate from room temperature to the second retention temperature, being kept for the second retention time, and cooled down naturally to room temperature.

An oxyfluoride and fluoride ceramics are oxidatively decomposed by moisture slightly contained in an inert gas, even though they are sintered in the inert gas, because of which it is hard to produce a high-density sintered body. If moisture in the heated green molded body is removed, the moisture contained in an atmosphere is suppressed from increasing during the sintering step, and thus oxidative decomposition of the oxyfluoride and fluoride ceramics can be prevented from proceeding.

In the conventional technology, the problem peculiar to oxyfluorides, i.e., the problem caused by moisture, has been solved by means of sintering at high temperature and high pressure and a special jig to block moisture. In the present invention, moisture is effectively removed in the process of degreasing and dehydrating the green molded body.

The second step is aimed at removing the remaining moisture, not adequately removed in the first step. On this account, the second heating rate should be greater than the first heating rate, the second retention temperature should be higher than the first retention temperature, and the second retention time should be longer than the first retention time. Ordinarily the second heating rate is 20 to 700° C./min. The second retention temperature is 750 to 1000° C., and preferably 800 to 980° C. The second retention time is 30 to 1500 min, and preferably 100 to 1000 min.

The second step is executed in an inert atmosphere including more gas than the air atmosphere in the first step. In the first step, binders and moisture in the molded body may be removed by simply opening a furnace without air supply. In such cases, if only the inert gas is circulated in the second step, the influx of air is suppressed even if air leak occurs locally. Consequently, the molded body is prevented from oxidizing.

In the first step, the heat treatment is conducted at a relatively low temperature for a short time in the air, i.e., an oxidizing atmosphere, mainly for the purpose of degreasing the heated green molded body. In the second step, the heat treatment is conducted in an inert atmosphere at a higher temperature for a longer time than in the first step, for the purpose of completely removing the remaining moisture. The second step is conducted not in the air but in an inert atmosphere for the following reason: Since the heated green molded body is exposed to high temperature in the air, the decomposition of $YF_3$ proceeds and causes a change of the composition of an oxyfluoride.

In addition, even if the second step is conducted in a vacuum, the molded body can be sintered.

If the green molded body is immediately exposed to heat treatment of high-temperature for a long time in the first step, the oxidation and decomposition of sintering aids and binders inside the green molded body can hardly keep up with the heat load, so it may be difficult to obtain the densified sintered body.

In the second step, heat treatment at a higher temperature for a longer time than that in the first step should be conducted in an inert atmosphere, in order to remove moisture not adequately removed in the first step completely from the heated green molded body. The inert gas used here is nitrogen, argon and so on. Inert gases contain less moisture than the air and have little risk of being contaminated with impurities in the air, so that they are desirable. After the first step, the second step is mostly to remove moisture, especially to discharge a very small amount of residual moisture in the heated green molded body outside.

There are no special restrictions with regard to the heating rates in both the first and the second steps. Any publicly known condition in the degreasing process of ceramic molded bodies will do. There are also no special restrictions with regard to the cooling rates. Natural cooling is preferred in terms of the manufacturing cost and productivity.

To give a specific example of each step described above, the first retention temperature is 350 to 600° C., the first retention time is 30 to 1200 min, the second retention temperature is 800 to 980° C., and the second retention time is 100 to 1000 min.

Next, the third process 3 is executed to sinter the molded body obtained in the process 2. Publicly well-known techniques can be applied to the sintering condition without being particularly limited thereto. To give an example, the sintering temperature is 700 to 1000° C. and the sintering atmosphere is an inert gas atmosphere.

As described above, moisture contained in the molded body is vaporized in the process 2, which thereby suppresses an increase in moisture content in an atmosphere during the sintering process and prevents the oxidative decomposition of the oxyfluoride and fluoride ceramics from proceeding. The present invention can therefore provide the high-density sintered body of oxyfluoride ceramics at relatively low temperature without any pressure-sintering operation as used in the conventional technology or without laying the molded body in moisture blocking materials etc.

It is not always easy to evaluate the moisture content in the molded body after the process 2. However in the present invention, the bulk density calculated by geometric measurement, for example, can be used as a surrogate index.

In the present invention, using the bulk density as a standard can reduce the influence of remaining moisture to a limited level, which thereby provides a sintered body of oxyfluoride ceramics with sufficiently high density.

As described above, the present invention can provide the oxyfluoride ceramic with excellent plasma resistance and can provide the sintered body with adequate density available for various components. Additionally, the nondestructive evaluation of the quality of the sintered body is realized by using an indicator of the chromaticity, which will be practically very useful.

EXAMPLES

Hereinafter, the present invention will be described in detail with reference to examples, but the present invention is not restricted to the following examples.

Example 1

A granulated powder of yttrium oxyfluoride (average grain size: 40 μm) was filled into a circular mold with a diameter of 20 mm and uniaxially pressed for 10 seconds at a pressure of ca. 30 MPa, which provided a primary molding. The primary molding was formed by cold isostatic pressing (CIP) under the condition of 147.1 MPa for 60 seconds. The obtained molded body (ca. ϕ20×10t) was placed into an alumina sheath and degreased in an air atmosphere at a heating rate of 50° C./h under the condition of 400° C. for 1 hour. The molded body was heated to 850° C. at a heating rate of 300° C./h at an argon supply rate of 2 L/min under atmospheric pressure, kept at 850° C. for 2 hours, and then naturally cooled down.

To put it concretely, the first retention temperature was 400° C. and the first retention time 60 minutes. The second retention temperature 850° C. and the second retention time 120 min. The molded body was sintered at 850° C. for 120 min in an inert gas atmosphere. A sintered body of yttrium oxyfluoride ceramics (ca. ϕ15×9t) was manufactured thereby.

Examples 2 to 5 Comparative Examples 1 to 5

Sintered bodies of yttrium oxyfluoride ceramics of Examples 2 to 5 and Comparative Examples 1 to 5 were manufactured in a manner similar to Example 1, but yet changed to the conditions shown in Table 1 concerning degreasing and sintering temperatures.

The density (g/cm$^3$) and the open porosity (%) of each sintered body manufactured by the above-described methods were measured by an Archimedes method and the L* value was obtained with a color-difference meter. Then, each of the sintered bodies was cut, the cross section was mirror-polished, and the textures were studied by SEM observation. The average crystal grain sizes were calculated from the SEM images. The etching test using $CF_4$ plasma was conducted on each sintered body. The manufacturing conditions and the measurement results are summarized in Table 1.

TABLE 1

| | Degreasing | Sintering Temperature (° C.) | Density (g/cm$^3$) | Open Porosity (%) | Average Crystal Grain Size (μm) | Percentage (%) of 1 to 5 μm-sized Crystal | L* value | a* value | b* value | Etching Rate (μm/h) |
|---|---|---|---|---|---|---|---|---|---|---|
| Ex. 1 | Yes | 850 | 5.0 | 3 | 5 | 70 | 59.9 | 0.4 | 2.3 | 0.2 |
| Ex. 2 | Yes | 880 | 5.1 | 0.5 | 3 | 90 | 44.5 | 0.3 | 1.6 | 0.03 |
| Ex. 3 | Yes | 900 | 5.1 | 0.5 | 4 | 85 | 41.8 | 0.3 | 2.3 | 0.015 |
| Ex. 4 | Yes | 940 | 5.1 | 0.1 | 3 | 87 | 37.7 | 0.2 | 2.0 | 0.016 |
| Ex. 5 | Yes | 1000 | 5.0 | 1.0 | 4 | 80 | 35.1 | −0.1 | 0.3 | 1 |
| Comp. Ex. 1 | No | 900 | 4.3 | 11 | 10 | 25 | 18.5 | −0.2 | 0.1 | 0.2 |
| Comp. Ex. 2 | Yes | 950 | 4.6 | 8.4 | 7 | 35 | 75.8 | 0.3 | 2.2 | 0.1 |

TABLE 1-continued

| | Degreasing | Sintering Temperature (° C.) | Density (g/cm$^3$) | Open Porosity (%) | Average Crystal Grain Size (μm) | Percentage (%) of 1 to 5 μm-sized Crystal | L* value | a* value | b* value | Etching Rate (μm/h) |
|---|---|---|---|---|---|---|---|---|---|---|
| Comp. Ex. 3 | No | 900 | 4.3 | 10 | 8 | 30 | 80.6 | 0.1 | 1.6 | 0.3 |
| Comp. Ex. 4 | Yes | 650 | 3.5 | 7 | 15 | 40 | 96.1 | 0.3 | 1.5 | 1 |
| Comp. Ex. 5 | Yes | 1200 | 4.1 | 15 | 12 | 20 | 93.7 | 0.2 | 1.2 | 0.5 |

Table 1 confirms that the sintered bodies containing 50% or more of crystals with grain sizes of 1 to 5 μm and having color difference L* values of 30 to 60 have significantly low etching rates. Even though the sintering temperature is the same, the sintered body manufactured without degreasing step is apt to have a higher etching rate, because the sintered body is not densified enough.

What is claimed is:

1. A ceramic sintered body for semiconductor manufacturing equipment, comprising:

an oxyfluoride with a polycrystalline structure having 50% or more of crystals with a grain size of 1 to 5 μm; or a mixture of the oxyfluoride and a fluoride, each having a polycrystalline structure in which 50% or more of the crystals have a grain size of 1 to 5 μm wherein an average crystal grain size is 3 μm or more and 5 μm or less, and wherein an L* value of 37.7 to 44.5, an a* value of 0.2 to 0.3 and a b* value of 1.6 to 2.0 in the L*a*b* color system.

2. The sintered body for semiconductor production equipment according to claim 1, wherein the oxyfluoride includes one or more rare-earth elements, selected from the group consisting of yttrium (Y), scandium (Sc), lanthanum (La), cerium (Ce), and gadolinium (Gd).

3. The sintered body for semiconductor production equipment according to claim 1, wherein the density thereof is at least 5.1 g/cm$^3$.

4. The sintered body for semiconductor production equipment according to claim 1, wherein the ceramic sintered body includes unavoidable impurities such as Na, K, Mg, Si, and Fe.

5. The sintered body for semiconductor production equipment according to claim 1, wherein the oxyfluoride has a polycrystalline structure and contains 85% or more and 90% or less of the crystals having a grain size of 1 to 5 μm.

6. The sintered body for semiconductor production equipment according to claim 5, wherein the density thereof is at least 5.1 g/cm$^3$.

* * * * *